(12) United States Patent
Chang et al.

(10) Patent No.: US 6,291,855 B1
(45) Date of Patent: Sep. 18, 2001

(54) CELL OF FLASH MEMORY DEVICE

(75) Inventors: Dong-soo Chang; Seung-woo Nam; Heung-kwun Oh, all of Yongin (KR)

(73) Assignee: Samsung Electronics Co., Ltd. (JP)

( * ) Notice: Subject to any disclaimer, the term of this patent is extended or adjusted under 35 U.S.C. 154(b) by 0 days.

(21) Appl. No.: 09/415,162

(22) Filed: Oct. 8, 1999

(30) Foreign Application Priority Data

Oct. 19, 1998 (KR) .................................................. 98-43715

(51) Int. Cl.[7] ........................ H01L 21/366; H01L 21/8238
(52) U.S. Cl. .......................... 257/316; 257/319; 257/321; 257/314; 257/239
(58) Field of Search ..................................... 257/239, 261, 257/316, 317, 319, 321

(56) References Cited

U.S. PATENT DOCUMENTS

| | | | |
|---|---|---|---|
| 5,960,285 | * 9/1999 | Hong | 257/321 |
| 6,040,216 | * 3/2000 | Sung | 257/315 |
| 6,103,573 | * 8/2000 | Harari et al. | 438/257 |

* cited by examiner

*Primary Examiner*—Eddie Lee
*Assistant Examiner*—Jesse A. Fenty
(74) *Attorney, Agent, or Firm*—Cantor Colburn LLP

(57) ABSTRACT

A flash memory cell and a method for fabricating the same are provided. A first conductive film exposing a predetermined area of a semiconductor substrate is formed on the semiconductor substrate, and a tunnel oxide and a first interlevel dielectric film are formed on the surface of the semiconductor substrate exposed by the first conductive film and on the surface of the first conductive film, respectively. A floating gate covering the tunnel oxide and extending to the upper portion of the first conductive film in the vicinity of the tunnel oxide is formed as a second conductive film, and a second interlevel dielectric film is formed on the surface of the floating gate. A third conductive film electrically connected to the first conductive film in the vicinity of the floating gate is formed on a second interlevel dielectric film, thereby forming a control gate electrode comprised of the first conductive film and the third conductive film.

5 Claims, 6 Drawing Sheets

CELL OF FLASH MEMORY DEVICE

BACKGROUND OF THE INVENTION

1. Field of the Invention

The present invention relates to a semiconductor device and a method for fabricating the same, and more particularly, to a cell of a flash memory device and a method for fabricating the same.

2. Description of the Related Art

In a flash memory device, even when power supply is interrupted, the information stored in a memory cell is not vanished. Thus, the flash memory device is widely adopted to a memory card used for a computer. A unit cell of a typical flash memory device has a gate structure in which a floating gate and a control gate electrode are sequentially stacked.

FIG. 1 is a cross-sectional view of a unit cell of a conventional flash memory device of the prior art.

Referring to FIG. 1, a source region 3a and a drain region 3b isolated from each other with a channel area being therebetween are formed on a semiconductor substrate 1. A tunnel oxide 5, a floating gate FG', a dielectric film 7 and a control gate electrode CG' are sequentially deposited on the channel area. The semiconductor substrate 1 is a P-type silicon substrate or a P-type well. The source region 3a and the drain region 3b are areas doped with impurity of a conductivity type different from that of the semiconductor substrate 1, i.e., N-type impurity layers. Also, the tunnel oxide 5 is formed of a thin thermal oxide having a thickness of 100 Å or less so that hot carriers generated at the channel area may pass through.

The programming operation of the unit cell shown in FIG. 1 is performed such that a voltage of 5–7 V is applied to the drain region 3b and a voltage of 10–12 V is applied to the control gate electrode CG'. Here, 0 V is applied to the source region 3a and the semiconductor substrate 1. In such a manner, if the respective voltages are applied to the control gate electrode CG', the source region 3a, the drain region 3b and the semiconductor substrate 1 for programming the unit cell, hot carriers, i.e., hot electrons, are generated at the channel area. The hot carriers pass through the tunnel oxide 5 to then be injected into the floating gate FG'. As a result, the programming operation is performed to increase a threshold voltage of the unit cell shown in FIG. 1.

Also, the erasing operation of the information stored in the unit cell shown in FIG. 1 is performed such that the control gate electrode CG' and the semiconductor substrate 1 are grounded, and a high voltage of 12–15 V is applied to the source region 3a. Here, the drain region 3b is floated. In such a manner, if the respective voltages are applied to the control gate electrode CG', the source region 3a, the drain region 3b and the semiconductor substrate 1 for erasing the unit cell, the electrons stored in the floating gate FG' pass through the tunnel oxide 5 by a voltage difference between the floating gate FG' and the source region 3a to then move to the source region 3a. Accordingly, the electrons in the floating gate FG' are all removed. As a result, the erasing operation is performed to adjust the voltage of the unit cell to an initial threshold voltage or below.

FIG. 2 is a schematic equivalent circuit diagram for explaining a capacitive coupling ratio of the unit cell shown in FIG. 1.

Referring to FIG. 2, capacitance C2 caused by the dielectric film 7 exists between the control gate electrode CG' and the floating gate FG', and capacitance C1 caused by the tunnel oxide 5 shown in FIG. 1 exists between the floating gate FG' and the semiconductor substrate 1, i.e., the channel area. Here, if a positive voltage $+V_{CG}$ and a positive voltage $+V_d$ are applied to the control gate electrode CG' and the drain region 3b, respectively, and 0 V is applied to the source region 3a and the semiconductor substrate 1, for programming the unit cell, the voltage $V_{FG}$ induced into the floating gate FG' can be expressed in the following formula (1):

$$V_{FG} \cong (C2 \div (C1+C2)) \times V_{CG} \qquad \ldots (1)$$

From the formula (1), it is understood that the voltage induced into the floating gate FG' is close to the voltage applied to the control gate electrode CG' as the capacitance C2 between the control gate electrode CG' and the floating gate FG' increases. Thus, if the capacitance C2 is increased relative to the capacitance C1, the programming efficiency can be increased and the programming voltage applied to the control gate electrode CG' can be reduced.

As a result, in order to increase the programming efficiency of a flash memory cell or reduce the programming voltage, it is necessary to increase the capacitance between a floating gate and a control gate electrode.

SUMMARY OF THE INVENTION

It is an objective of the present invention to provide a flash memory cell which can increase the programming efficiency and can reduce the programming voltage.

It is another objective of the present invention to provide a method for fabricating the flash memory cell.

Accordingly, to achieve the above objective of the present invention, there is provided a floating gate formed as a second conductive film and a control gate electrode on a semiconductor substrate. The floating gate covers a tunnel oxide formed on a predetermined area of the semiconductor substrate and extends to the upper portion of the semiconductor substrate in the vicinity of the tunnel oxide. A first conductive film is interposed between the extending portion of the floating gate covering the tunnel oxide and the semiconductor substrate so that an overlapped portion of the first conductive film and the floating gate exists. An insulation film thicker than the tunnel oxide is interposed between the first conductive film and the semiconductor substrate. The insulation film between the first conductive film and the semiconductor substrate is preferably formed of an isolation film and a gate insulation film, positioned in parallel with each other. Here, the gate insulation film contacts the tunnel oxide and the isolation film contacts the gate insulation film. The insulation film may be formed of only an isolation film. A first interlevel dielectric film is interposed between the floating gate and the first conductive film. The first interlevel dielectric film and the tunnel oxide may be formed simultaneously during the same processing step. A third conductive film is formed on the floating gate. A second interlevel dielectric film is formed between the third conductive film and the floating gate. Also, the third conductive film is electrically connected to the first conductive film in the vicinity of the floating gate. Here, the first conductive film and the third conductive film constitute the control gate electrode. Thus, the control gate electrode extends to the lower portion of edges of the floating gate to increase the overlapped area of the floating gate and the control gate electrode.

The tunnel oxide is preferably formed of a thermal oxide having a thickness of 100 Å or less, and the first and second conductive films are preferably formed of a doped polysilicon film. Also, the third conductive film is preferably formed of a doped polysilicon film or a metal polycide film.

To achieve the second objective, according to the present invention, a first conductive film exposing a predetermined area of a semiconductor substrate is formed on the semiconductor substrate. A tunnel oxide and a first interlevel dielectric film are formed on the surface of the semiconductor substrate exposed by the first conductive film and on the surface of the first conductive film, respectively. An insulation film thicker than the tunnel oxide, e.g., an insulation film formed by a gate insulation film and an isolation film disposed parallel with each other, exists between the first conductive film and the semiconductor substrate. The gate insulation film is formed in the vicinity of the tunnel oxide and the isolation film is formed in the vicinity of the gate insulation film. The first interlevel dielectric film is preferably formed during the same processing step with the tunnel oxide. The insulation film between the first conductive film and the semiconductor substrate may be formed of only the isolation film or the gate insulation film.

A second conductive film is formed over the entire surface of the semiconductor substrate having the first interlevel dielectric film and the tunnel oxide. The second conductive film is patterned to form a second conductive film pattern covering the tunnel oxide and extending to the upper portion of the first conductive film in the vicinity of the tunnel oxide. Accordingly, edges of the second conductive film pattern overlap with the first conductive film. The second conductive film is preferably formed to extend to the upper portion of edges of the isolation film. The second conductive film pattern is isolated from the first conductive film by the first interlevel dielectric film.

A second interlevel dielectric film is formed over the entire surface of the semiconductor substrate having the second conductive film pattern. The second interlevel dielectric film and the first interlevel dielectric film are sequentially patterned to expose the first conductive film in the vicinity of the second conductive film pattern. A third conductive film is formed over the entire surface of the semiconductor substrate having the exposed first conductive film. The third conductive film is isolated from the second conductive film pattern by the second interlevel dielectric film.

The third conductive film, the second interlevel dielectric film, the second conductive film pattern, the first interlevel dielectric film and the first conductive film are sequentially patterned to form the control gate electrode and the floating gate intersecting the isolation film. The control gate electrode is formed of the third conductive film and the first conductive film electrically connected to each other, and the floating gate is formed of the second conductive film pattern covering the tunnel oxide and surrounded by the control gate electrode.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Preferred embodiments of the present invention will now be described in detail with reference to the accompanying drawings.

Figure 3:
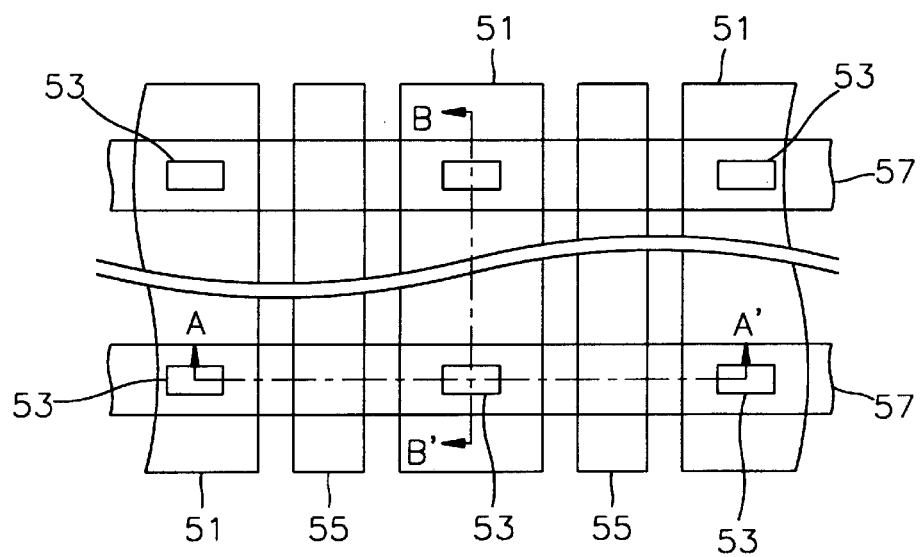
FIG. 3 is a layout diagram of a flash memory cell according to the present invention.

FIG. 3 is a layout diagram of a flash memory cell according to the present invention, 2-dimensionally arranged.

Referring to FIG. 3, a plurality of active region patterns 51 are arranged parallel to each other, and a plurality of wordline patterns 57 are arranged in a direction cross the plurality of active region patterns 51. A tunnel oxide pattern 53 for defining an area where a tunnel oxide is to be formed is disposed on a predetermined portion of each intersection of the active region patterns 51 and the word line patterns 57. An etching mask pattern 55 for isolating floating gates of cell neighboring along the direction of the wordline pattern 57 is disposed between the active region patterns 51. The etching mask pattern 55 is preferably disposed to expose the region between the respective active region patterns 51, i.e., the center of an isolation region. The tunnel oxide pattern 53 may be of the same pattern as the active region pattern 51. In other words, the tunnel oxide may be formed on an area defined by the active region pattern 51, i.e., on the entire surface of the active region.

Figure 4:
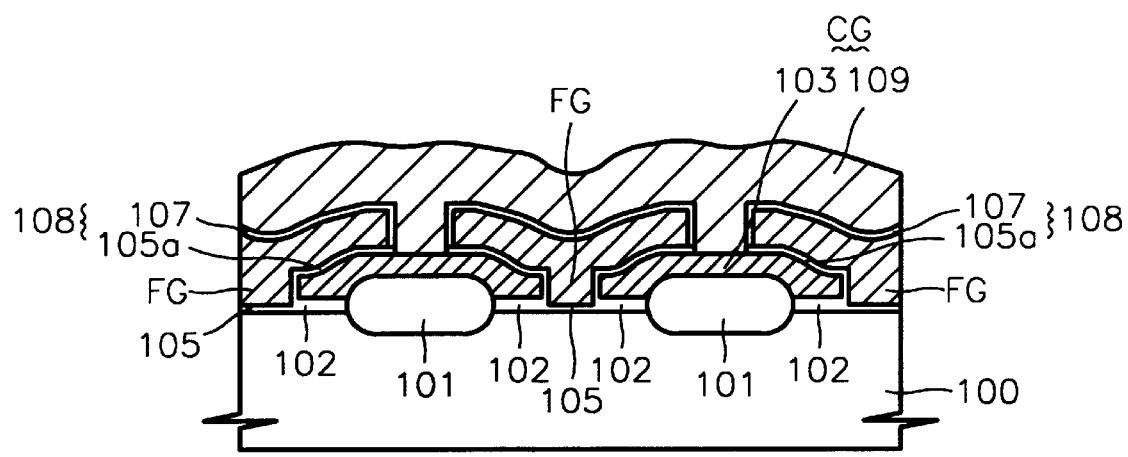
FIG. 4 is a cross-sectional view taken along the line AA' of FIG. 3.
Figure 5:
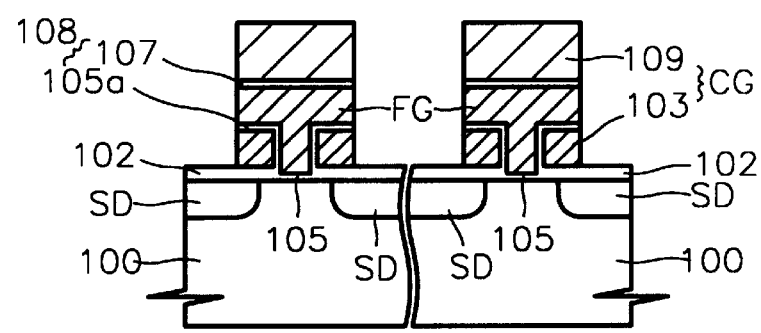
FIG. 5 is a cross sectional view taken along the line BB' of FIG. 3.

FIG. 4 is a cross-sectional view illustrating a flash memory cell according to the present invention, taken along the line AA' of FIG. 3, and FIG. 5 is a cross sectional view, illustrating a flash memory cell according to the present invention, taken along the line BB' of FIG. 3.

Referring to FIGS. 4 and 5, isolation films 101 parallel to each other are formed on a predetermined area of a semiconductor substrate 100. A gate insulation film 102 is formed on an active region between the respective isolation films 101, and a tunnel oxide 105 thinner than the gate insulation film 102 is formed on a predetermined area of the active region. The tunnel oxide 105 is preferably formed of a thin thermal oxide having a thickness of 100 Å or less. A first conductive film 103 exposing the tunnel oxide 105 is formed on the predetermined area of the gate insulation film 102 and on the isolation films 101. The first conductive film 103 is preferably formed of a doped polysilicon film. A first interlevel dielectric film 105a is formed on the surface of the first conductive film 103. The first interlevel dielectric film 105a may be formed simultaneously with the tunnel oxide 105. A floating gate FG formed as a second conductive film is positioned on the tunnel oxide 105. The floating gate FG covers the first conductive film 103 in the vicinity of the tunnel oxide 105 as well as the tunnel oxide 105. The floating gate FG is isolated from the first conductive film 103 by the first interlevel dielectric film 105a. A second interlevel dielectric film 107 is formed on the surface of the floating gate FG. A third conductive film 109 is formed on the second interlevel dielectric film 107. The third conductive film 109 is isolated from the floating gate FG by the second interlevel dielectric film 107. The third conductive film 109 is electrically connected to the first conductive film 103 between neighboring floating gates FGs, as shown in FIG. 4. The first conductive film 103 and the third conductive film 109 constitute a control gate electrode CG. Also, the first interlevel dielectric film 105a and the second interlevel dielectric film 107 constitute an interlevel dielectric film 108 surrounding the floating gate FG and interposed between the control gate electrode CG and the floating gate FG. Referring back to FIG. 5, a source/drain region SD is formed on the surface of the semiconductor substrate 100 at both sides of a gate pattern formed by stacking the first conductive film 103, the second conductive film (FG) and the third conductive film 109.

As described above, the flash memory cell according to the present invention includes a control gate electrode surrounding the upper and lower portions of a floating gate. Accordingly, the flash memory cell whose capacitance between the floating gate and the control gate electrode is maximized can be realized.

Next, a method for fabricating the flash memory cell according to the present invention will be described.

FIGS. 6A, 7A, 8A and 9A are cross-sectional views illustrating a sequence of steps of manufacturing process, taken along the line AA' of FIG. 3, and FIGS. 6B, 7B, 8B and 9B are cross-sectional views illustrating a sequence of steps of manufacturing process, taken along the line BB' of FIG. 3.

Figure 6A:
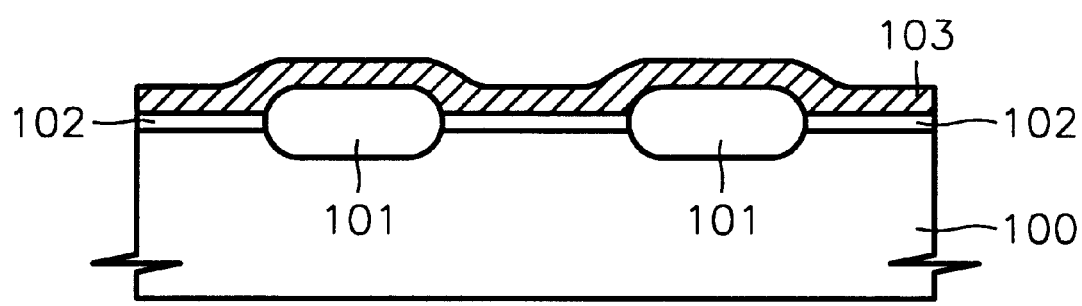
FIGS. 6A, 7A, 8A and 9A are cross-sectional views illustrating a sequence of steps of manufacturing process, taken along the line AA' of FIG. 3.
Figure 6B:
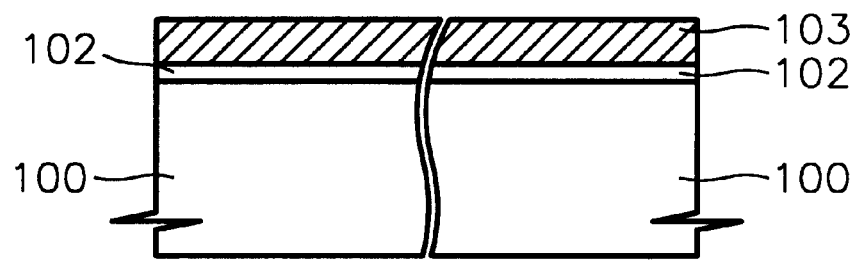
FIGS. 6B, 7B, 8B and 9B are cross-sectional views illustrating a sequence of steps of manufacturing process, taken along the line BB' of FIG. 3.

Referring to FIGS. 6A and 6B, isolation films 101 are formed on a predetermined area of a semiconductor substrate 100, e.g., a P-type silicon substrate, using a photo mask in which the active region pattern 51 of FIG. 3 is drawn. The isolation films 101 are formed using a conventional isolation process, e.g., a LOCOS (LOCal Oxidation of Silicon) process or a trench isolation process. A gate insulation film 102 is formed on an active region between the isolation films 101. The gate insulation film 102 may be formed simultaneously with a gate insulation film of a MOS transistor (not shown) formed in a peripheral circuit area. The gate insulation film 102 is preferably formed of a thermal oxide, to a thickness of 150–300 Å. A first conductive film 103, e.g., a doped polysilicon film, is formed over the entire surface of the semiconductor substrate 100 having the gate insulation film 102.

Figure 7A:
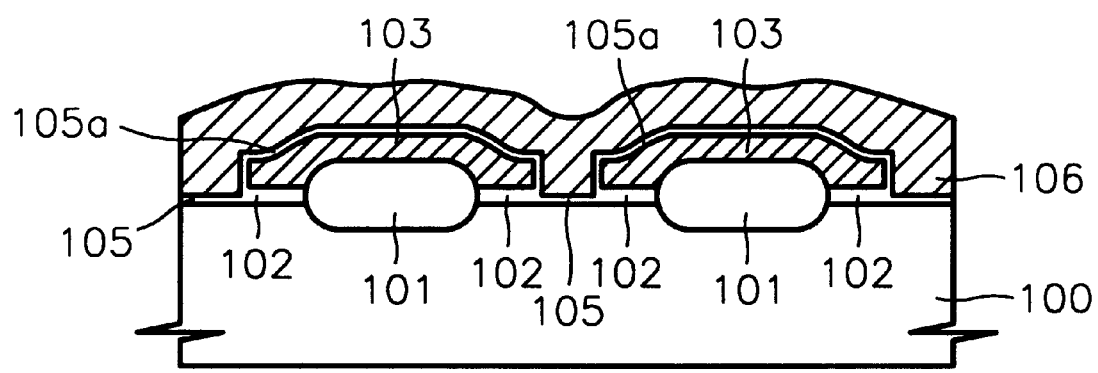
Figure 7B:
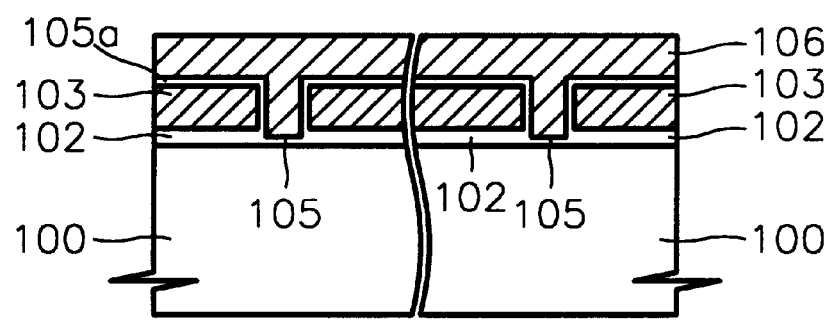

Referring to FIGS. 7A and 7B, the first conductive film 103 and the gate insulation film 102 are sequentially patterned using a photo mask in which the tunnel oxide pattern 53 of FIG. 3 is drawn, thereby exposing a predetermined area of the active region. Instead of the photo mask in which the tunnel oxide 53 of FIG. 3 is drawn, a photo mask having a reverse pattern of the active region pattern 51 of FIG. 3 drawn therein may be used. In this case, the entire surface of the active region is exposed. The semiconductor substrate 100 having a predetermined area of the exposed active region is thermally oxidized to form a thin tunnel oxide 105 having a thickness of 100 Å or less on the surface of the exposed active region. Here, a first interlevel dielectric film 105a formed of a thermal oxide is formed on the surface of the first conductive film 103, e.g., a doped polysilicon film. A second conductive film 106, e.g., a doped polysilicon film, is formed over the entire surface of the semiconductor substrate 100 having the tunnel oxide 105 and the first interlevel dielectric film 105a. The second conductive film 106 is isolated from the first conductive film 103 by the first interlevel dielectric film 105a, as shown in FIGS. 7A and 7B.

Figure 8A:
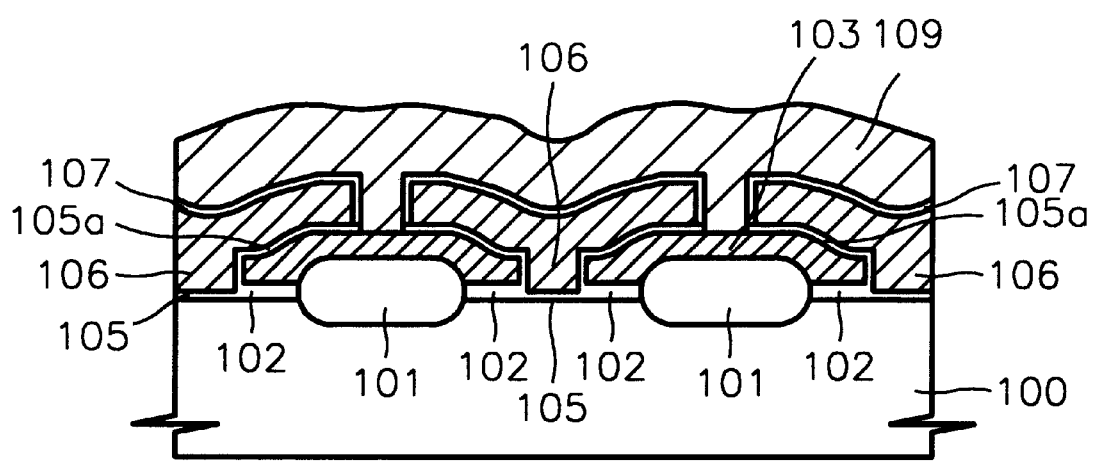
Figure 8B:
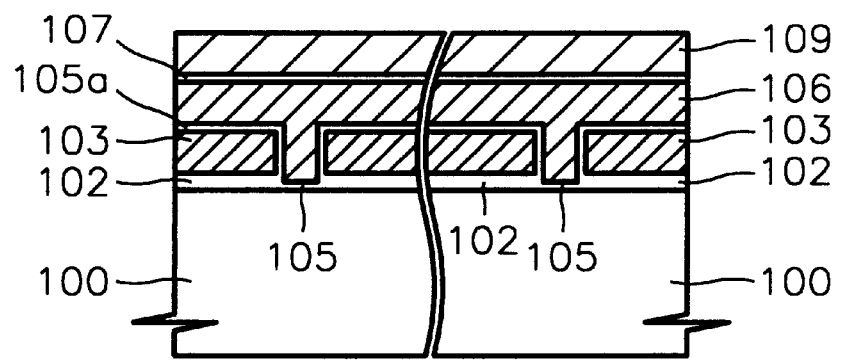

Referring to FIGS. 8A and 8B, the second conductive film 106 is patterned using a photo mask in which the etching mask pattern 55 of FIG. 3 is drawn, thereby forming a second conductive film pattern 106 exposing the first interlevel dielectric film 105a formed on the isolation film 101. Here, the exposed first interlevel dielectric film 105a may be further etched to expose the first conductive film 103 on the isolation film 101. The second conductive film pattern 106 is preferably formed to extend to the upper portion of edges of the isolation film 101, as shown in FIG. 8A. A second interlevel dielectric film 107 is formed over the entire surface of the semiconductor substrate 100 having the second conductive film pattern 106. The second interlevel dielectric film 107 is preferably formed of a material film having a high dielectric constant, e.g., a N/O (Nitride/Oxide) film or an ONO (Oxide/Nitride/Oxide) film. Also, the second interlevel dielectric film 107 may be formed of a thermal oxide. The second interlevel dielectric film 107 and the first interlevel dielectric film 105a are sequentially patterned, thereby exposing the first conductive film 103 between neighboring second conductive film patterns 106 along a direction of the wordline patterns 57 of FIG. 3. Here, in the case when the first interlevel dielectric film 105a is further etched in forming the second conductive film pattern 106, only the second interlevel dielectric film 107 is patterned to expose the first conductive film 103 between the second conductive film patterns 106. A third conductive film 109, e.g., a doped polysilicon film or a metal polycide film, is formed over the entire surface of the semiconductor substrate 100 having a predetermined portion of the exposed first conductive film 103. As the metal polycide film, a tungsten polycide film is widely used.

Figure 9A:
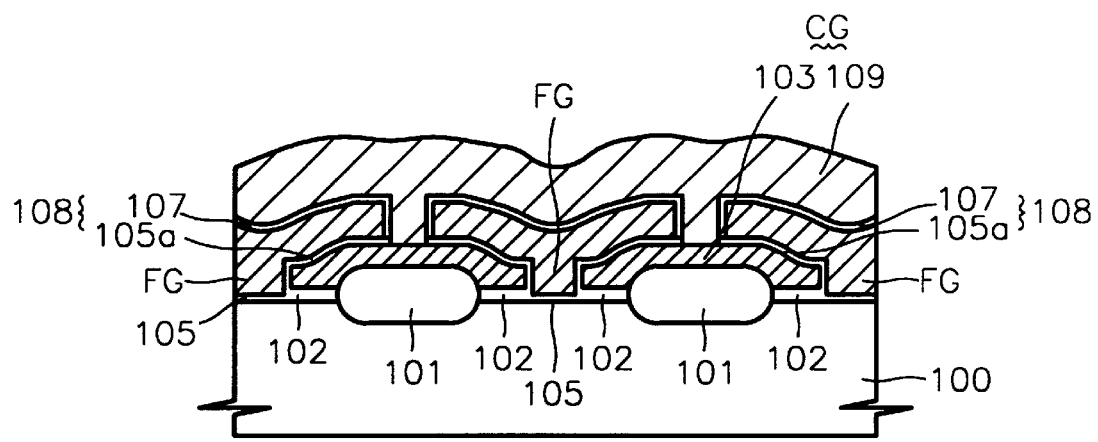
Figure 9B:
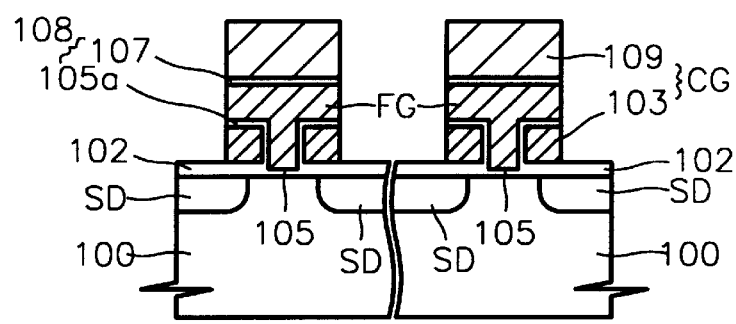

Referring to FIGS. 9A and 9B, the third conductive film 109, the second interlevel dielectric film 107, the second conductive film pattern 106, the first interlevel dielectric film 105a and the first conductive film 103 are sequentially patterned using a photo mask having the wordline pattern 57 of FIG. 3 drawn therein, thereby forming the floating gate FG formed of the second conductive film pattern 106 and the control gate electrode CG formed of the first conductive film 103 and the third conductive film 109. As shown in FIGS. 9A and 9B, the first conductive film 103 and the third conductive film 109 constituting the control gate electrode CG are electrically connected to each other at the area between neighboring cells along a direction of the wordline patterns 57 of FIG. 3. The control gate electrode CG also exists under the edges of the floating gate FG, thereby maximizing the overlapped area of the floating gate and the control gate electrode CG. The first interlevel dielectric film 105a and the second interlevel dielectric film 107 constitute an interlevel dielectric film 108 interposed between the floating gate FG and the control gate electrode CG. Impurity of a conductivity type different from that of the semiconductor substrate 100, e.g., an N-type impurity, is implanted into the active region at both sides of the gate pattern comprised of the floating gate FG and the control gate electrode CG, thereby forming a source/drain region SD.

Figure 1:
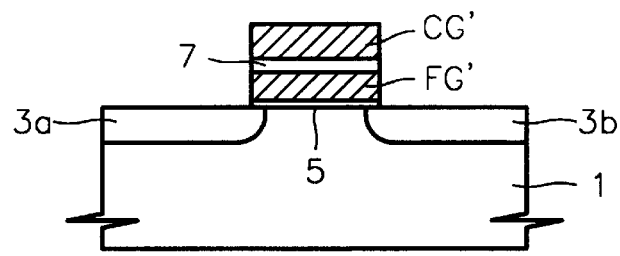
FIG. 1 is a cross-sectional view illustrating a conventional flash memory cell.
Figure 2:
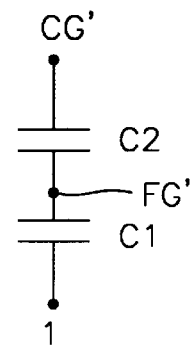
FIG. 2 is an equivalent circuit diagram of a typical flash memory cell.

As described above, according to the present invention, since the overlapped area of a floating gate and a control gate electrode can be maximized, a capacitive coupling ratio of a flash memory cell can be increased. Also, capacitance C1 described referring to FIG. 2 can be decreased by reducing the area occupied by a tunnel oxide. Accordingly, the capacitive coupling ratio of the flash memory cell can be further increased. As a result, a flash memory cell having an excellent programming efficiency can be implemented and the programming voltage thereof can be reduced.

The invention is not limited to the above-described embodiment and various changes and modifications may be made by one skilled in the art.

What is claimed is:

1. A flash memory cell comprising:

a semiconductor substrate;

an insulated first conductive film formed on the semiconductor substrate, the first conductive film exposing a predetermined area of the semiconductor substrate;

a tunnel oxide formed on the exposed predetermined area of the semiconductor substrate;

a floating gate formed on the tunnel oxide as a second conductive film and extending to the upper portion of the first conductive film in the vicinity of the tunnel oxide;

a third conductive film formed on the floating gate, electrically connected to the first conductive film in the vicinity of the floating gate, serving as a control gate electrode together with the first conductive film; and an interlevel dielectric film comprising a first interlevel dielectric film interposed between the floating gate and the first conductive film, and a second interlevel dielectric film interposed between the floating gate and the third conductive film.

2. The flash memory cell according to claim 1, wherein an isolation film and a gate insulation film are interposed between the first conductive film and the semiconductor substrate, parallel to each other.

3. The flash memory cell according to claim 2, wherein the gate insulation film contacts the tunnel oxide and is thicker than the tunnel oxide.

4. The flash memory cell according to claim 1, wherein the first interlevel dielectric film comprises the same material film as the tunnel oxide.

5. The flash memory cell according to claim 1, wherein the second interlevel dielectric film is either an ONO (Oxide/Nitride/Oxide) film or a NO (Nitride/Oxide) film.

* * * * *